(12) United States Patent
Medelius et al.

(10) Patent No.: US 6,801,868 B1
(45) Date of Patent: Oct. 5, 2004

(54) REAL TIME CALIBRATION METHOD FOR SIGNAL CONDITIONING AMPLIFIERS

(75) Inventors: Pedro J. Medelius, Merritt Island, FL (US); Carlos T. Mata, Rockledge, FL (US); Anthony Eckhoff, Cocoa, FL (US); Jose Perotti, Merritt Island, FL (US); Angel Lucena, Orlando, FL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 10/283,353

(22) Filed: Oct. 15, 2002

(51) Int. Cl.[7] ............................................. G05B 23/02
(52) U.S. Cl. ........................................................ 702/107
(58) Field of Search ..................... 702/107, 64; 710/16, 710/100, 310, 113, 36, 240, 301, 69; 375/359; 11/107; 711/152

(56) References Cited

U.S. PATENT DOCUMENTS

| | | | |
|---|---|---|---|
| 4,800,513 A | | 1/1989 | Deutsch |
| 4,847,569 A | | 7/1989 | Dudziak et al. |
| 5,065,351 A | | 11/1991 | Johnson et al. |
| 5,089,979 A | | 2/1992 | McEachern et al. |
| 5,327,539 A | * | 7/1994 | Sudo et al. ................. 710/107 |
| 5,361,218 A | | 11/1994 | Tripp et al. |
| 5,444,644 A | * | 8/1995 | Divjak ......................... 702/64 |
| 5,485,120 A | | 1/1996 | Anvari |
| 5,734,596 A | | 3/1998 | Medelius et al. |
| 5,742,200 A | | 4/1998 | He |
| 6,249,753 B1 | | 6/2001 | Mason et al. |
| 6,470,399 B1 | * | 10/2002 | Tasler ......................... 710/16 |

OTHER PUBLICATIONS

Heinz–Peter Beckemeyer, Interfacing the TLV1544 and TLV1548 A/D conveters to Digital processors, Dec. 1997.*

* cited by examiner

*Primary Examiner*—John Barlow
*Assistant Examiner*—Tung S Lau
(74) *Attorney, Agent, or Firm*—Randall M. Heald; Gary Borda; Harry Lupuloff

(57) ABSTRACT

A signal conditioning amplifier receives an input signal from an input such as a transducer. The signal is amplified and processed through an analog to digital converter and sent to a processor. The processor estimates the input signal provided by the transducer to the amplifier via a multiplexer. The estimated input signal is provided as a calibration voltage to the amplifier immediately following the receipt of the amplified input signal. The calibration voltage is amplified by the amplifier and provided to the processor as an amplified calibration voltage. The amplified calibration voltage is compared to the amplified input signal, and if a significant error exists, the gain and/or offset of the amplifier may be adjusted as necessary.

20 Claims, 2 Drawing Sheets

REAL TIME CALIBRATION METHOD FOR SIGNAL CONDITIONING AMPLIFIERS

ORIGIN OF THE INVENTION

The invention described herein was made in the performance of work under a NASA contract and by employees of the United States Government and is subject to the provisions of Public Law 96–517 (35 U.S.C. §202) and may be manufactured and used by or for the Government for governmental purposes without the payment of any royalties thereon or therefore. In accordance with 35 U.S.C. §202, the contractor elected not to retain title.

BACKGROUND OF THE INVENTION

1. Field of the Invention

This invention relates to a method for calibration of signal conditioning amplifiers and more particularly to a method of calibrating a signal conditioning amplifier which maintains data and integrity even in the presence of a hostile environment through the use of continuous calibration.

2. Prior Art

Across the electronics industry there are common problems that exist with field instrumentation. Signal conditioners frequently need to be removed from service for calibration. Calibration has traditionally been performed in a shop environment with traceable test equipment, typically on an annual basis. The need for shop calibration often keeps this particular maintenance from being performed routinely. Furthermore, this type of maintenance can usually only be accomplished during system outages or if a spare instrument can replace a device.

In cases where the instrument is invasive to a mechanical system, the removal of the instrument may require the use of labor from several different departments and trade group representatives. In order to avoid the need to remove components from field instrumentation for calibration, a need exists for a low-cost signal conditioner that is capable of performing continuous health checks and auto-calibration. This could significantly reduce the cost associated with periodic calibration and there would be no need to remove the signal conditioner from its operating location.

One attempt to calibrate amplifiers in the field has been to periodically interlace the signal from a transducer with a fixed calibration voltage reference. Unfortunately, this operation has typically resulted in a compromise between the amplifier bandwidth (also referred as analog bandwidth) and the acceptable noise level. The interlacing of the fixed reference voltage with the signal, sometimes at vastly different voltage levels, requires a large analog bandwidth to ensure that both, the signal from the transducer and the calibration reference voltage, could settle to acceptable limits (i.e., one part in 65536 for a 16 bit system). This requirement results in an analog bandwidth eleven times larger than the Nyquist frequency. This large analog bandwidth typically results in an aliasing problem as well as larger-than-desirable noise floor. U.S. Pat. No. 4,800,513 apparently utilizes this calibration technique.

U.S. Pat. No. 5,734,596 utilizes a signal and provides a first amplifier to assist in calibrating a second amplifier. Accordingly, the signal received by the first amplifier is not utilized to calibrate the first amplifier.

Accordingly, a need exists for a low-cost signal conditioner capable of performing continuous field checks and auto-calibration to significantly reduce operation and maintenance costs of a data acquisition system. Furthermore, a capability to perform continuous calibration will assure that short term variations and performance such as those caused by temperature changes, as well as long term variations such as those resulting from aging are compensated for in real time.

SUMMARY OF THE INVENTION

Consequently, an object of the present invention is to provide a low cost signal conditioner capable of performing continuous health checks and auto-calibration.

Another object of the present invention is to continuously calibrate an amplifier to correct for both short-term variations in performance as well as long-term variations in performance.

Yet another object of the present invention is to provide a calibration technique which does not result in a larger-than-desirable noise floor while still providing the desired analog bandwidth.

Accordingly, a transducer provides a signal to an amplifier such as through a low pass filter and a multiplexer. The output of the amplifier is preferably digitized and provided to a controller, such as a digital signal processor, which reads the voltage and estimates the voltage delivered by the transducer to the amplifier based upon the nominal gain of the amplifier. The estimated input voltage, locally generated, is then applied to the amplifier path immediately after the signal from the transducer has been digitized so that the calibration voltage is still close to the voltage of the time-varying sensor output. The output of the amplifier is then digitized again, and the values obtained from the application of calibration voltages as well as output voltages are compared to dynamically compensate for shifting gain and offset in the amplifier path. Accordingly, a smaller analog bandwidth is required and a reduced noise level is provided by this method and apparatus. Furthermore, reduced settling times for the output of the amplifier are provided since the calibration voltage is similar to the amplified voltage of the transducer signal. Although in the preferred embodiment presented here the digitized signal processing functions are implemented by the use of a Digital Signal Processor (DSP), these functions could be implemented with any controller technology such as but not limited to processors, microcontrollers, microprocessors, microcomputers or any other digital signal processing technology.

BRIEF DESCRIPTION OF THE DRAWINGS

The particular features of the invention as well as other objects will become apparent from the following description taken in connection with the accompanying drawings in which.

DETAILED DESCRIPTION OF THE PREFERRED EMBODIMENT

Figure 1:
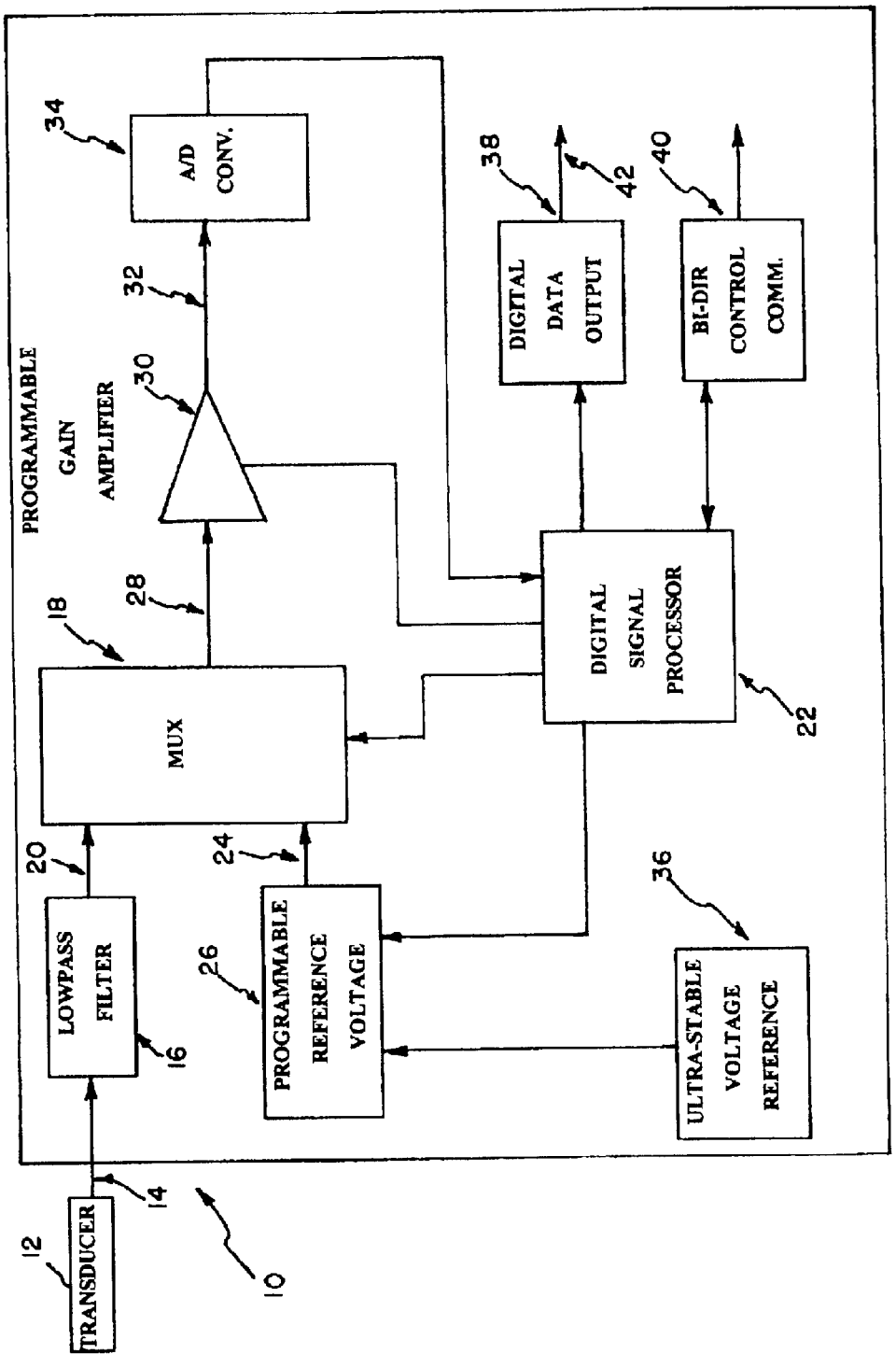
FIG. 1 is a schematic plan of the signal conditioning amplifier of the preferred embodiment of the present invention.
Figure 2:
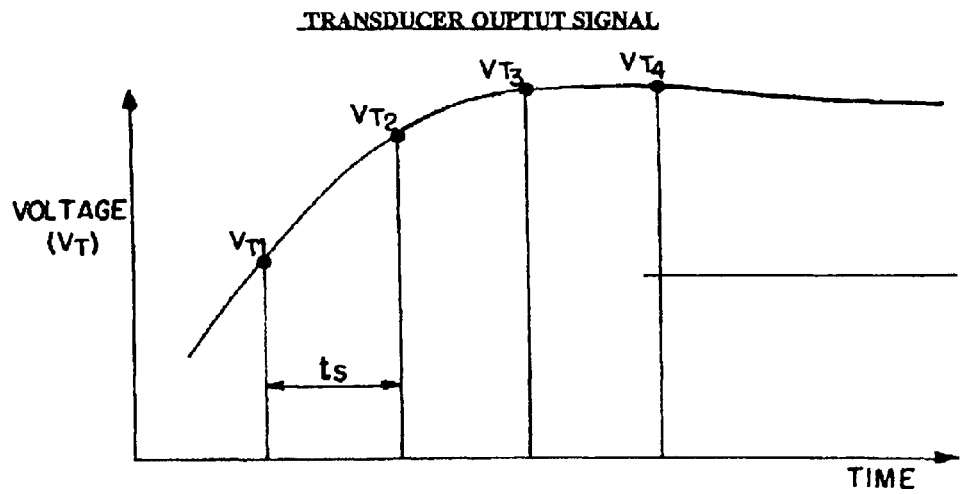
FIG. 2 is a graph of a sample transducer output signal.
Figure 3:
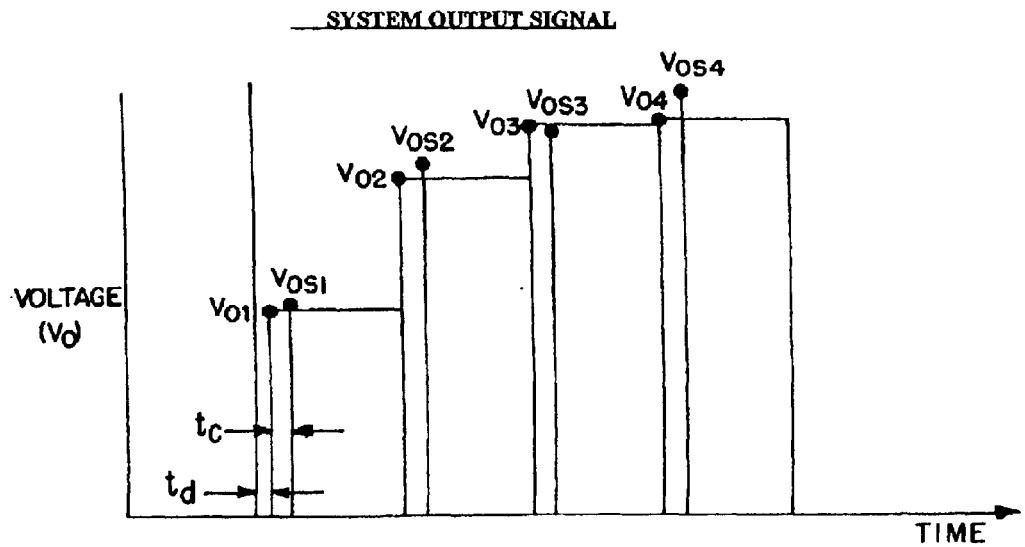
FIG. 3 is a graph of a system output signal based on the input of FIG. 2.
Figure 4:
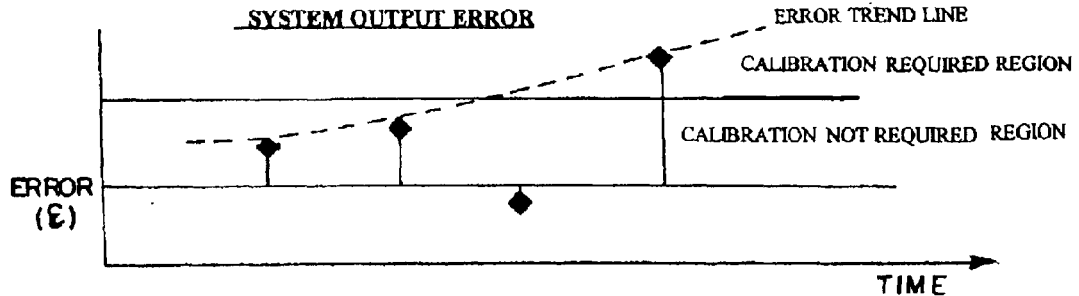
FIG. 4 is a graph of system output error.

Referring to FIG. 1, showing the signal conditioning amplifier 10, and FIGS. 2–4 showing hypothetical performance characteristics of the signal conditioning amplifier 10, the present invention will be described.

FIG. 1 shows the signal conditioning amplifier (SCA) 10 which receives input from transducer 12. Although the transducer 12 is illustrated, other signal generation devices known in the art could be utilized as well. The transducer 12 outputs a signal 14 to the SCA 10. The signal 14 is preferably processed by a filter 16 such as the low pass filter illustrated. Of course, the signal 14 could be directly provided to the amplifier 30 or to the multiplexer 18 as illustrated.

The multiplexer 18 receives signal 20 from the filter 16 or signal 14 directly from an input. The multiplexer 18 may be controlled by digital signal processor (DSP) 22 (in the preferred embodiment) to switch between input signal 20 and calibration voltage signal 24 provided by the programmable reference voltage generator 26 as will be described in further detail below. When the input signal 20 is provided from the transducer 12 after being filtered by filter 16, it is provided as multiplexer output 28 to the input of amplifier 30 which is illustrated as a programmable gain amplifier. The amplifier output signal 32 is preferably provided to an analog to digital converter and then sent to the digital signal processor 22.

The digital signal processor 22 reads the digitized voltage of the transducer signal after it has been amplified by the amplifier 30. For example, if the DSP 22 reads four volts and the gain of the amplifier 30 was set to 100, the signal from the transducer 12 would be estimated to have been 40 millivolts (mV) nominal. Utilizing a digital to analog converter such as the programmable reference voltage 26, an estimated calibration voltage 24 is provided through the multiplexer 18 as an input to amplifier input 28. This is preferably done immediately after the signal from the transducer 12 has been digitized so that the calibration voltage 24 is still close to the input voltage 20 which is time varying according to the output 14 of the transducer 12.

The output from the amplifier 30 as taken from the calibration voltage 24 is then compared to the amplified transducer signal to dynamically compensate for any shifts in gain and offset of the amplifier path as will be explained in more detail below. The programmable reference voltage 26 may receive a signal from an ultrastable voltage reference 36 which may, or may not, be a part of the digital signal processor 22.

From the digital signal processor 22, an output is sent via a digital data output 38 for further processing by field instrumentation and/or other assorted components, processors, etc. Furthermore, a control communicator 40 may provide an input or receive an output from the digital signal processor 22 as illustrated.

FIGS. 2–4 are helpful in showing the preferred operation of the signal conditioning amplifier 10. In FIG. 2, a sample or exemplary voltage ($V_T$) as provided from transducer 12 is shown. The sampling period as illustrated is $t_s$. $V_{Tn}$ is sample (n) of the transducer signal. With the output signal 42 from the digital data output 38 from the digital signal processor 22, $V_{On}$ is the sample (n) from the system output signal. This is the amplifier output signal 32 digitized by A/D converter 34 or digital data output signal 42 used by the SCA 10 or field instrumentation and/or other assorted components.

When sensing the voltage output 14 from the transducer 12, a total system time delay $T_d$ occurs that includes the time to produce amplifier output 32, and the time to digitize and process the resulting output signal which is recorded as $V_{On}$. Immediately after sensing the output from the amplifier output 32, the digital signal processor 22 generates an estimated output signal $V_{OSn}$ which is a sample (n) of the system output with simulated input from calibration circuit which is provided by the programmable reference voltage 26 and/or digital signal processor 22 as calibrated input voltage 24 to the multiplexer 18. This is then run through the amplifier 30 and provided as amplifier output 32 back to the digital signal processor 22 after digitization by the A/D converter 34. This value is recorded as $V_{Osn}$.

As can be seen in FIG. 3, when the SCA 10 components involved in the signal conditioning path, including amplifier 30, are not properly calibrated, the values for the system output signal based on the transducer output signal ($V_{On}$) are not exactly equal to the system output signal based upon the simulated input from the calibration circuit ($V_{Osn}$). FIG. 4 shows the system output error ($\epsilon$) over time. There may be a region where calibration adjustment is not required and a region where calibration of the SCA 10 is required (as shown in FIG. 4).

In normal operation, a time-varying signal having an analog bandwidth (BW) is provided as transducer output 14. Output 14 is sampled at a sampling rate $f_g$, where $f_g$ is greater or equal than a Nyquist frequency ($f_g >= 2*$ BW). Sampling is typically conducted periodically, at intervals, and/or as is known in the art.

The sampled signal ($V_{ti}$) is processed by a signal conditioner such as the filter 16, multiplexer 18, amplifier 30, A/D converter 34, and Digital Signal Processor 22 and a digitized output signal 42 is generated $t_d$ seconds later, where $t_d$ is the overall system delay.

The generated output ($V_{oi}$) is a linear relationship of the sampled input where: $V_{oi} = A_s * V_{ti} + O_s$, where $A_s$ is the system present channel gain and $O_s$ is the system preset channel offset.

In order to calibrate the signal conditioning Amplifier SCA 10, immediately after the output signal ($V_{oi}$) is computed by the system, a calibration signal is calculated and applied to the input of the system. The operation takes $t_c$ seconds. It is essential that $t_d$ and $t_c$ delays are much smaller than $1/f_g$.

The calculations used in the preferred embodiment to generate the calibration input signals ($V_{si}$) are: $V_{si} = (V_{oi} - O_i)/A_i$ where $A_i$ is the system ideal channel gain and $O_i$ is the system ideal channeled offset.

The calibration input signal ($V_{Si}$) is processed by the signal conditioner, and an output is generated $t_c$ seconds later. The generated output ($O_{Si}$) has a linear relationship with a sample input where $V_{OSi} = A_s * V_{Si} + O_S$. If ideal gain $A_i$ is equal to present gain $A_s$ and ideal offset $O^i$ is equal to a present offset $O_S$ then $V_{OSi}$ is equal to $V_{Si}$ and no system error signal is generated ($\epsilon = 0$). However, if ideal gain $A_i$ is not equal to present gain $A_s$ and/or offset $O_i$ is not equal to present offset $O_{Si}$ then $V_{OSi}$ is not equal $V_{Oi}$ and a system error signal is generated ($\epsilon \neq 0$). The calculated system error can be used to compensate real time for the system variances. If $\epsilon$ is within a limit such as a preset limit, the digital signal processor 22 may also not adjust the gain or offset in some embodiments. However, if the error exceeds the limit, the gain and/or the offset are adjusted to attempt to calibrate the SCA 10. Furthermore, when the system error has exceeded another limit, a channel can be taken off the line and recalibrated or discarded. The digital signal processor 22 provides a signal to the amplifier 30 to adjust the gain and/or offset as necessary.

Numerous alternations of the structure herein disclosed will suggest themselves to those skilled in the art. However, it is to be understood that the present disclosure relates to the preferred embodiment of the invention which is for purposes of illustration only and not to be construed as a limitation of the invention. All such modifications which do not depart from the spirit of the invention are intended to be included within the scope of the appended claims.

Having thus set forth the nature of the invention, what is claimed herein is:

1. A method of calibrating a signal conditioner amplifier comprising the steps of:

receiving an input signal;

providing the input signal at a first input to a multiplexer, said multiplexer also configured to receive a calibration signal at a second input;

providing the input signal to an amplifier having a programmable gain initially set at a present channel gain, said amplifier receiving the input signal from an output of the multiplexer, said amplifier providing an amplified output of the input signal;

an analog-to-digital converter receiving the amplified output of the amplifier and providing a digitized signal;

a processor receiving the digitized signal and outputting digital data; following the receipt of the digitized signal, the processor calculating an estimated input signal based on the received digitized signal and the present channel gain of the amplifier, providing said estimated input signal as the calibration signal to the multiplexer at the second input which is then transmitted to and amplified by the amplifier to provide an amplified calibration signal; and the amplified calibration signal is then processed by the analog-to-digital converter and received by the processor with said processor comparing the amplified calibration signal to the digitized signal.

2. The method of claim 1 wherein the input signal is received as a voltage.

3. The method of claim 1 wherein the calibration signal is provided as a voltage.

4. The method of claim 1 wherein the amplifier is provided with a programmable gain and a channel offset.

5. The method of claim 1 further comprising a filter which receives the input signal and provides a filtered signal to the input of the multiplexer.

6. The method of claim 2 wherein the voltage is provided by a transducer.

7. The method of claim 3 wherein the calibration voltage is provided to the multiplexer by a programmable reference voltage generator.

8. The method of claim 7 wherein the programmable reference voltage generator receives an input from an ultra-stable voltage reference.

9. A method of calibrating a signal conditioner amplifier comprising the steps of:

receiving an input signal;

providing the input signal at a first input to a multiplexer, said multiplexer also configured to receive a calibration signal at a second input;

providing the input signal to an amplifier having a programmable gain initially set at a present channel gain, said amplifier receiving the input signal from an output of the multiplexer, said amplifier providing an amplified output;

an analog-to-digital converter receiving the amplified output of the amplifier and providing a digitized signal;

a processor receiving the digitized signal and outputting digital data; following the receipt of the digitized signal, the processor calculating an estimated input signal based on the received digitized signal and the present channel gain of the amplifier, providing said estimated input signal as the calibration signal to the multiplexer at the second input which is then transmitted to the amplifier to provide an amplified calibration signal; and the amplified calibration signal is then processed by the analog-to-digital converter and received by the processor with said processor comparing the amplified calibration signal to the digitized transducer signal;

The method of claim 1 wherein the estimated input signal is generated by subtracting a present channel offset from the digitized signal and then dividing by a system present channel gain.

10. A method of calibrating a signal conditioner amplifier comprising the steps of:

receiving an input signal;

providing the input signal at a fit input to a multiplexer, said multiplexer also configured to receive a calibration signal at a second input;

providing the input signal to an amplifier having a programmable gain initially set at a present channel gain, said amplifier receiving the input signal from an output of the multiplexer, said amplifier providing an amplified output;

an analog-to-digital converter receiving the amplified output of the amplifier and providing a digitized signal;

a processor receiving the digitized signal and outputting digital data; following the receipt of the digitized signal, the processor calculating an estimated input signal based on the received digitized signal and the present channel gain of the amplifier, providing said estimated input signal as the calibration signal to the multiplexer at the second input which is then transmitted to the amplifier to provide an amplified calibration signal; and the amplified calibration signal is then processed by the analog-to-digital converter and received by the processor with said processor comparing the amplified calibration signal to the digitized transducer signal;

The method of claim 1 wherein a difference between the digitized signal and the amplified calibration signal is calculated as an error, and the error is utilized to determine whether adjustment at least one of the present channel gain and an offset is necessary.

11. The method of claim 10 wherein if the error is within a preset limit, no adjustment is made to the present channel gain and offset of the signal conditioning amplifier.

12. A method of calibrating a signal conditioner amplifier comprising the steps of: receiving an input signal;

providing the input signal at a first input to a multiplexer, said multiplexer also configured to receive a calibration signal at a second input;

providing the input signal to an amplifier having a programmable gain initially set at a present channel gain, said amplifier receiving the input signal from an output of the multiplexer, said amplifier providing an amplified output;

an analog-to-digital converter receiving the amplified output of the amplifier and providing a digitized signal;

a processor receiving the digitized signal and outputting digital data; following the receipt of the digitized signal, the processor calculating an estimated input signal based on the received digitized signal and the present channel gain of the amplifier, providing said estimated input signal as the calibration signal to the multiplexer at the second input which is then transmitted to the amplifier to provide an amplified calibration signal; and the amplified calibration signal is then processed be the analog-to-digital converter and received by the processor with said processor comparing the amplified calibration signal to the digitized transducer signal;

The method of claim 10 wherein if the error is outside of a preset limit, the processor provides a signal to the amplifier to adjust at least one of the present channel gain and the channel offset.

13. The method of claim 12 wherein the output of the amplifier is linear according to a formula: output voltage equals channel offset plus the product of input voltage multiplied by channel gain.

14. The method of claim 12 wherein the preset limit is zero.

15. The method of claim 13 wherein at least two amplified calibration signals and their respective amplified input signals are compared by the processor to adjust at least one of the channel gain and channel offset.

16. A method of calibrating a signal conditioner amplifier comprising the steps of:

receiving an input signal;

providing the input signal at a first input to a multiplexer, said multiplexer also configured to receive a calibration signal at a second input;

providing the input signal to an amplifier having a programmable gain initially set at a present channel gain, said amplifier receiving the input signal from an output of the multiplexer, said amplifier providing an amplified output;

an analog-to-digital converter receiving the amplified output of the amplifier and providing a digitized signal;

a processor receiving the digitized signal and outputting digital data; following the receipt of the digitized signal, the processor calculating an estimated input signal based on the received digitized signal and the present channel gain of the amplifier, providing said estimated input signal as the calibration signal to the multiplexer at the second input which is then transmitted to the amplifier to provide an amplified calibration signal; and the amplified calibration signal is then processed by the analog-to-digital converter and received by the processor with said processor comparing the amplified calibration signal to the digitized transducer signal;

The amplifier of claim 1 wherein the estimated input signal is calculated at a sampling frequency greater than the Nyquist frequency.

17. A method of calibrating a signal conditioning amplifier comprising the steps of:

a transducer providing an input voltage to a multiplexer;

a multiplexer receiving the input voltage;

a programmable gain amplifier receiving an input from an output of the multiplexer, said amplifier providing an output by amplifying the output received from the new signals;

an analog-to-digital converter receiving the output of the amplifier and providing a digitized signal;

a processor receiving the digitized signal and outputting digital data, said processor also at intervals estimating the value of the input voltage from the transducer as an estimated input signal;

providing the estimated input signal as a calibration signal to the multiplexer;

said multiplexer providing the calibration signal to the amplifier which is amplified as an amplified calibration signal;

said amplified calibration signal then provided to the analog-to-digital converter which is then received by the processor, and then comparing said amplified calibration signal to the digitized signal.

18. The method of claim 17 wherein the intervals are periodic.

19. A method of calibrating a signal conditioning amplifier comprising the steps of:

a transducer providing an input voltage to a multiplexer;

a multiplexer receiving the input voltage;

a programmable gain amplifier receiving an input from an output of the multiplexer, said amplifier providing an output;

an analog-to-digital converter receiving the output of the amplifier and providing a digitized signal;

a processor receiving the digitized signal and outputting digital data, said processor also at intervals estimating the value of the input voltage from the transducer as an estimated input signal;

providing the estimated input signal as a calibration signal to the multiplexer;

said multiplexer providing the calibration signal to the amplifier which is amplified as an amplified calibration signal;

said amplified calibration signal then provided to the analog-to-digital converter which is then received by the processor, and then comparing said amplified calibration signal to the digitized signal; and the programmable gain amplifier has a present channel offset and a present channel gain and substantially operates under the equation voltage out equals channel offset plus the product of channel gain multiplied by voltage in, and said processor utilizes present channel gain and present channel offset to estimate the estimated input signal.

20. The amplifier of claim 19 wherein a difference between the amplified calibration signal and the digitized signal is an error, and when comparing the amplified calibration signal to the digitized signal, if said error exceeds a predetermined limit, said processor provides a signal to adjust at least one of the present channel gain and present channel offset of the amplifier.

* * * * *